(12) United States Patent
Lin et al.

(10) Patent No.: US 7,456,043 B2
(45) Date of Patent: Nov. 25, 2008

(54) METHOD OF FABRICATING MICROPHONE DEVICE AND THERMAL OXIDE LAYER AND LOW-STRESS STRUCTURAL LAYER THEREOF

(75) Inventors: Hung-Yi Lin, Tao-Yuan Hsien (TW); Yao-Tian Chow, Tai-Chung Hsien (TW); Pin-Ting Liu, Kao-Hsiung Hsien (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 367 days.

(21) Appl. No.: 11/308,283

(22) Filed: Mar. 15, 2006

(65) Prior Publication Data
US 2007/0066027 A1    Mar. 22, 2007

(30) Foreign Application Priority Data
Sep. 21, 2005    (TW) .............................. 94132649 A (51) Int. Cl.
*H01L 21/00* (2006.01)
*H01L 21/76* (2006.01)
(52) U.S. Cl. ........................................ 438/53; 438/424

(58) Field of Classification Search .................... 438/53
See application file for complete search history.

(56) References Cited

U.S. PATENT DOCUMENTS

| | | | | |
|---|---|---|---|---|
| 5,889,872 A | * | 3/1999 | Sooriakumar et al. | ....... 381/174 |
| 2005/0012175 A1 | * | 1/2005 | Tsuruta | ...................... 257/531 |
| 2006/0263990 A1 | * | 11/2006 | Burke et al. | ................ 438/296 |

* cited by examiner

Primary Examiner—Lex Malsawma
(74) Attorney, Agent, or Firm—Winston Hsu (57) ABSTRACT

A substrate is provided and a plurality of trenches are formed in the front surface of the substrate. Then, a thermal oxide layer is formed on inner walls of the trenches and the front surface of the substrate. Subsequently, a first structural layer is formed on the thermal oxide layer, dopants are implanted into the first structural layer, a second structural layer is formed on the first structural layer, and an annealing process is performed to reduce the stress of the first and second structural layers. Following that, the first and second structural layers are patterned to form diaphragms. Finally, the second structural layer is mounted on a support wafer with a bonding layer, and the back surface of the substrate is etched by deep etching techniques to form back chambers corresponding to the diaphragms. Each back chamber has a vertical sidewall and partially exposes the first structural layer.

9 Claims, 15 Drawing Sheets

METHOD OF FABRICATING MICROPHONE DEVICE AND THERMAL OXIDE LAYER AND LOW-STRESS STRUCTURAL LAYER THEREOF

BACKGROUND OF THE INVENTION

1. Field of the Invention

The present invention pertains to a method of fabricating a microphone device, and more particularly, to a method capable of reducing cycle time of thermal oxide layer fabrication and reducing stress of structural layer.

2. Description of the Prior Art

Microphone devices formed by MEMS techniques have gradually replaced conventional microphone devices due to their small size and reliability. In various types of MEMS microphone devices, capacitive microphone device is the most popular one due to its high sensitivity, low self-noise, and low distortion.

Figure 1:
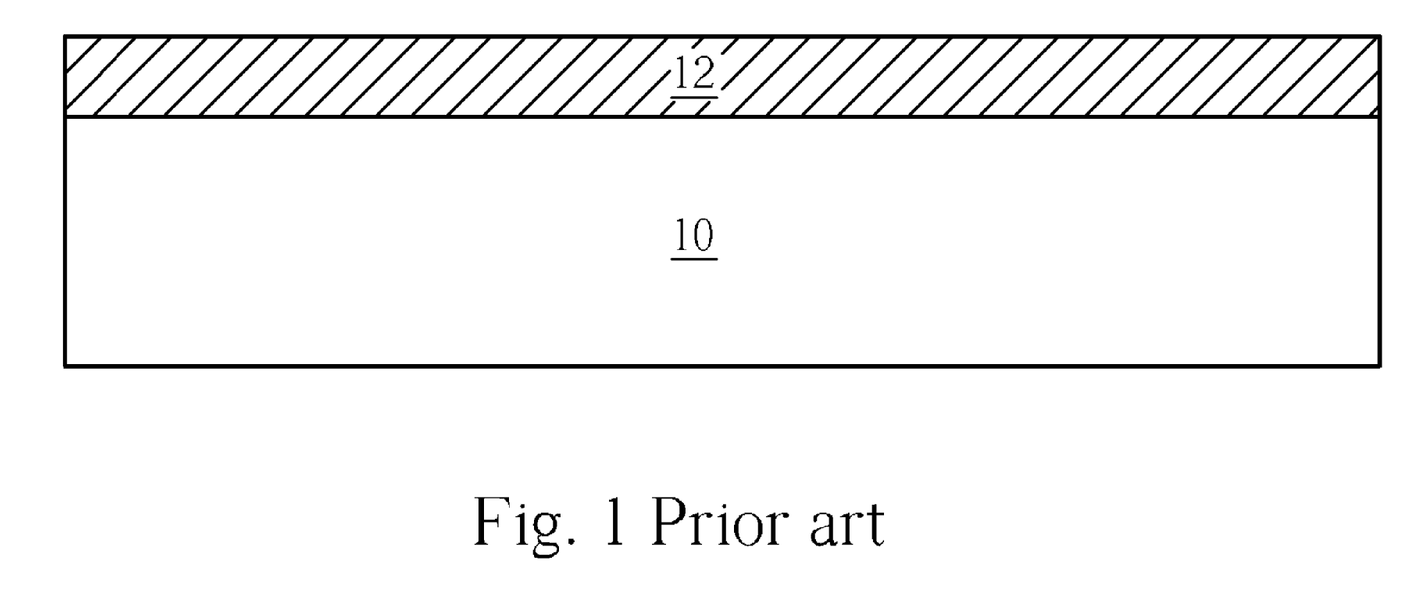
FIG. 1 to FIG. 6 are diagrams schematically illustrating a conventional method of fabricating capacitive microphone device.

With reference to FIG. 1 to FIG. 6, FIG. 1 to FIG. 6 are diagrams schematically illustrating a conventional method of fabricating a capacitive microphone device. For easy illustration, FIG. 1 to FIG. 6 merely illustrate one capacitive microphone device. As shown in FIG. 1, a substrate 10 is provided, and an oxide layer 12 is formed on the front surface of the substrate 10. The oxide layer 12 serves as a sacrificial layer to support a structural layer formed later, and the oxide layer 12 will be removed in successive process so as to form a suspended diaphragm. Normally, in order to let the diaphragm sharply response to the vibration due to a sound pressure, the thickness of the oxide layer 12 must reach several micrometers. However, it requires extremely long time to thermally form the oxide layer 12 of several micrometers thick. For instance, if the thickness of the oxide layer 12 reaches 4 micrometers, it requires about 50 hours to thermally form the oxide layer 12. As a result, the oxide layer 12 is normally formed by deposition. However, the deposited oxide layer 12 has mediocre physical characteristics. For example, the adhesion between the oxide layer 12 and the substrate 10 is poor, and therefore the yield is reduced.

Figure 2:
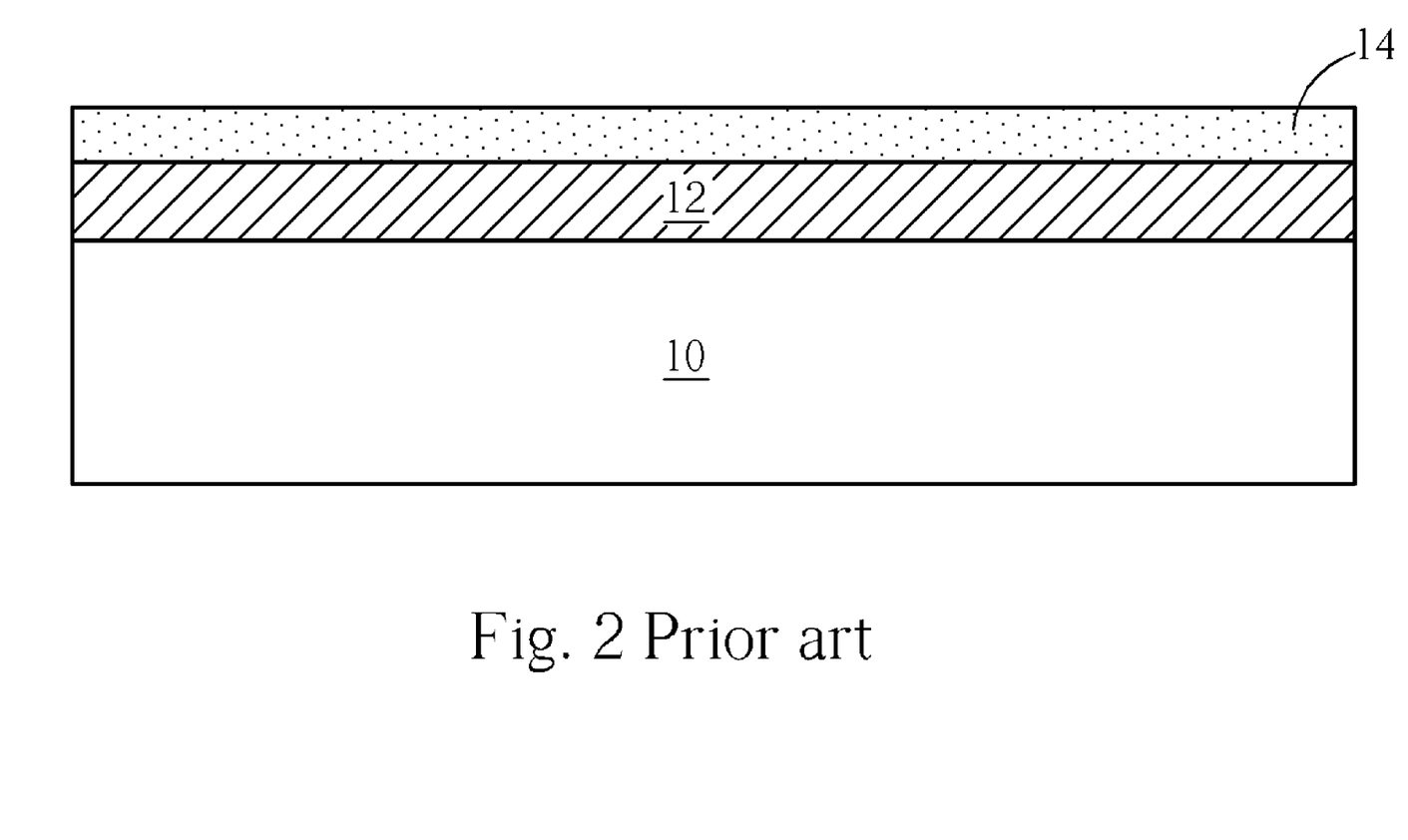

As shown in FIG. 2, a structural layer 14, which serves as an upper electrode of the capacitive microphone device, is deposited on the oxide layer 12. Theoretically, the stress of the structural layer 14 increases as the structural layer 14 gets thicker, and therefore the thickness would affect the flatness of the structural layer 14. For fabricating a capacitive microphone device with a thicker structural layer 14, the structural layer 14 formed by conventional method is not qualified.

Figure 3:
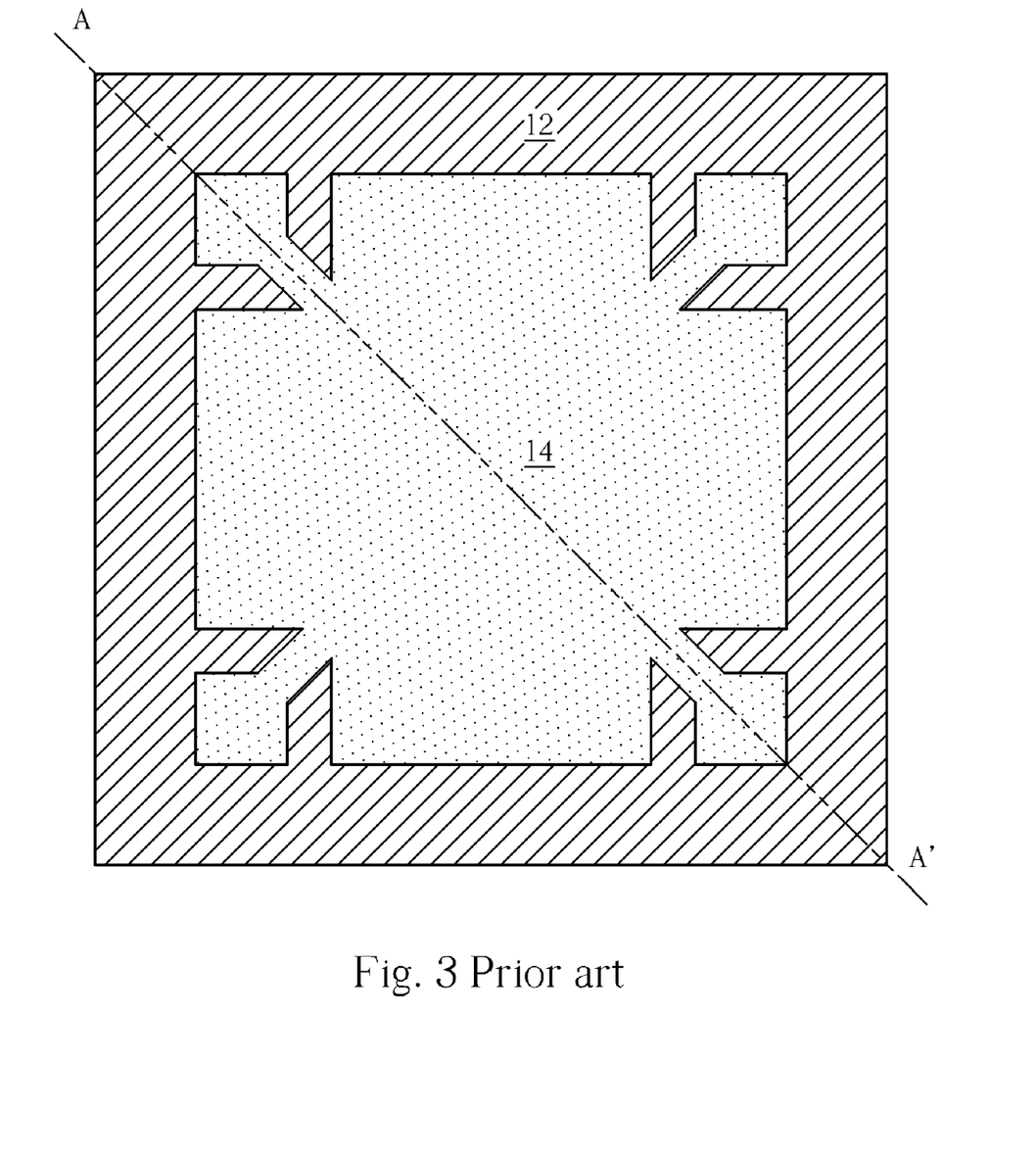
Figure 4:
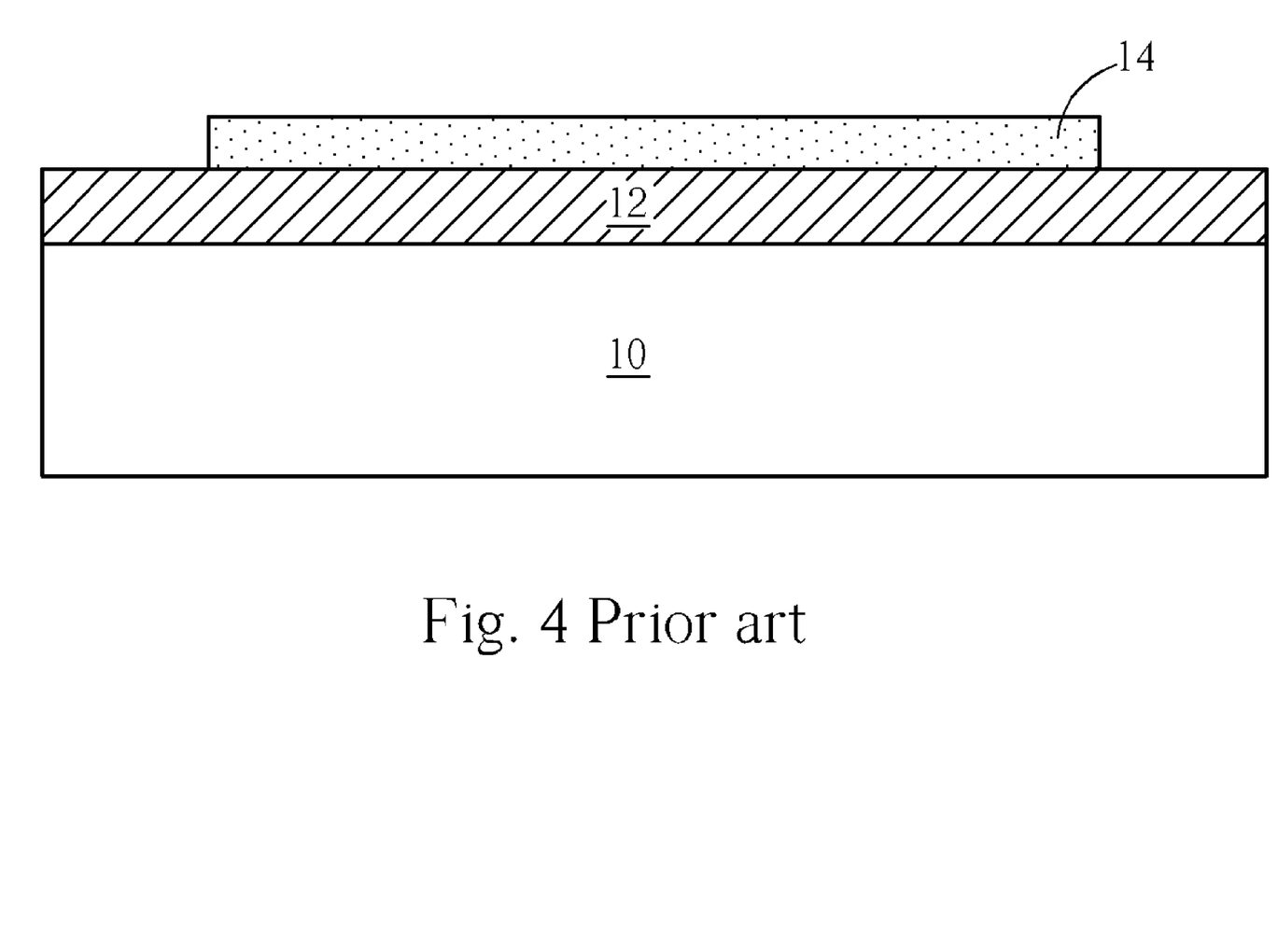
Figure 5:
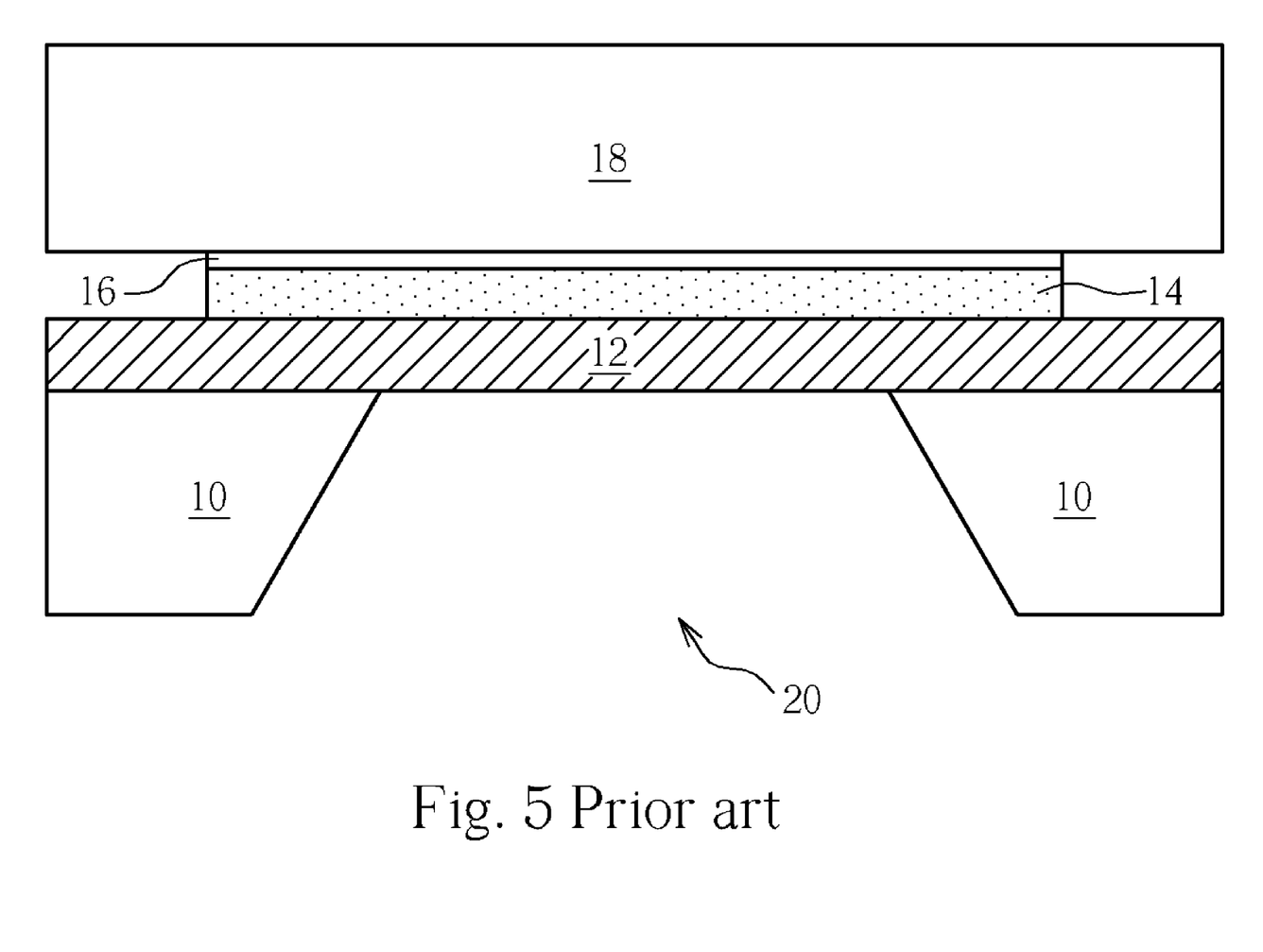
Figure 6:
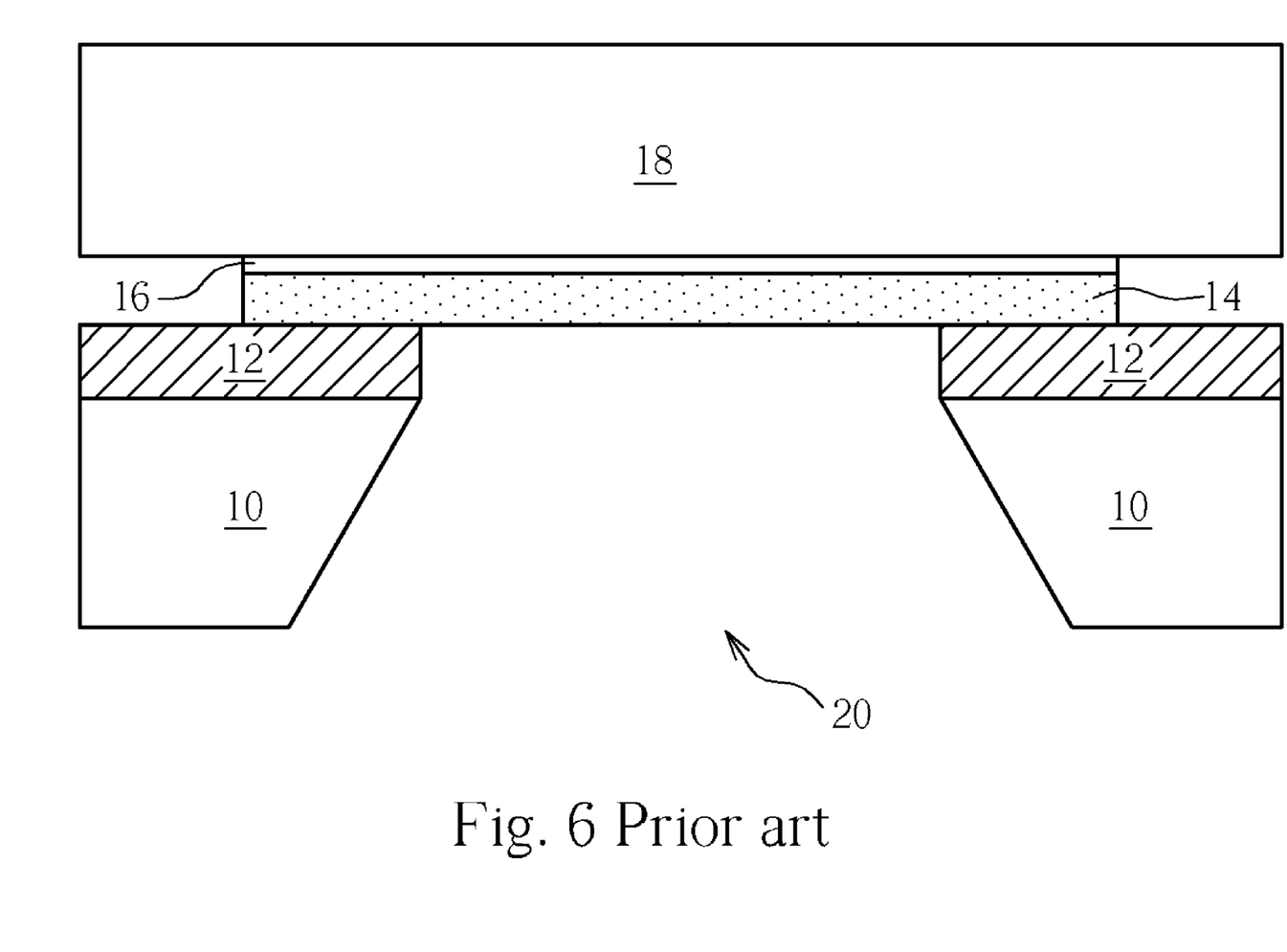

Referring to FIG. 3 and FIG. 4, FIG. 3 is a top view and FIG. 4 is a cross-sectional view along a tangent line AA'. As shown in FIG. 3 and FIG. 4, the structural layer 14 is partially removed by photolithography and etching techniques to define the location of a diaphragm. A shown in FIG. 5, the structural layer 14 is mounted on a support wafer 18 with a bonding layer 16. Subsequently, an anisotropic wet etching process, e.g. using potassium hydroxide (KOH) solution, to etch the substrate 10 made of silicon from the back surface so as to form a back chamber 20. The sidewall of the back chamber 20 is outwardly inclined as shown in FIG. 5. As shown in FIG. 6, a portion of the oxide layer 12 is etched off through the back chamber 20, so that the structural layer 14 is suspended.

The conventional method of fabricating capacitive microphone devices has the following disadvantages. First, to obtain a sufficient thickness, the oxide layer is formed by chemical vapor deposition. This leads to poor adhesion between the oxide layer and the substrate. In addition, the conventional method suffers from high stress and low flatness when a thicker structural layer is required. Furthermore, the sidewall of the back chamber is outwardly inclined, and this reduces the integration of the capacitive microphone devices.

SUMMARY OF THE INVENTION

It is therefore one object of the claimed invention to provide a method of fabricating microphone device to reduce cycle time, stress, and improve device integration.

According to the claimed invention, a method of fabricating a microphone device is provided. First, a substrate is provided, and a plurality of trenches are formed in a front surface of the substrate. Then, a thermal oxidation process is performed to form a thermal oxide layer on inner walls of the trenches and on the front surface of the substrate, the thermal oxide layer filling up the trenches. Subsequently, a first structural layer is formed on the thermal oxide layer, and dopants are implanted in the first structural layer. Thereafter, a second structural layer is formed on the first structural layer, and an annealing process is performed to reduce a stress of the first structural layer and the second structural layer. Following that, the second structural layer is mounted on a support wafer, and a plurality of back chambers is formed in a back surface of the substrate by deep etching techniques. Each back chamber has a vertical sidewall, and the back chambers partially expose the first structural layer.

According to the claimed invention, a method of fabricating a thermal oxide layer is provided. First, a substrate is provided, and a plurality of trenches are formed in a surface of the substrate. Subsequently, a thermal oxidation process is performed to form a thermal oxide layer on inner walls of the trenches and the surface of the substrate. The thermal oxide layer fills up the trenches, and an overall thickness of the thermal oxide layer is equal to a depth of the trenches plus a thickness of the thermal oxide layer formed on the front surface of the substrate.

According to the claimed invention, a method of fabricating a low-stress structural layer is provided. First, a substrate is provided, and a first structural layer is formed on a surface of the substrate. Then, dopants are implanted in the first structural layer, and a second structural layer is formed on the first structural layer. Following that, an annealing process is performed to reduce a stress of the first structural layer and the second structural layer. The first structural layer and the second structural layer form a low-stress structural layer.

These and other objectives of the present invention will no doubt become obvious to those of ordinary skill in the art after reading the following detailed description of the preferred embodiment that is illustrated in the various figures and drawings.

DETAILED DESCRIPTION

Referring to FIG. 7 to FIG. 15, FIG. 7 to FIG. 15 are schematic diagrams illustrating a method of fabricating a microphone device in accordance with a preferred embodiment of the present invention. It is appreciated that FIG. 7 to FIG. 15 only illustrate one microphone device, and the fabrication of microphone device may be divided into three stages: the first stage is to form a thermal oxide layer (illustrated in FIG. 7 to FIG. 9); the second stage is to form a structural layer (illustrated in FIG. 10 to FIG. 13); and the third stage is to form a back chamber (illustrated in FIG. 14 and FIG. 15).

Figure 7:
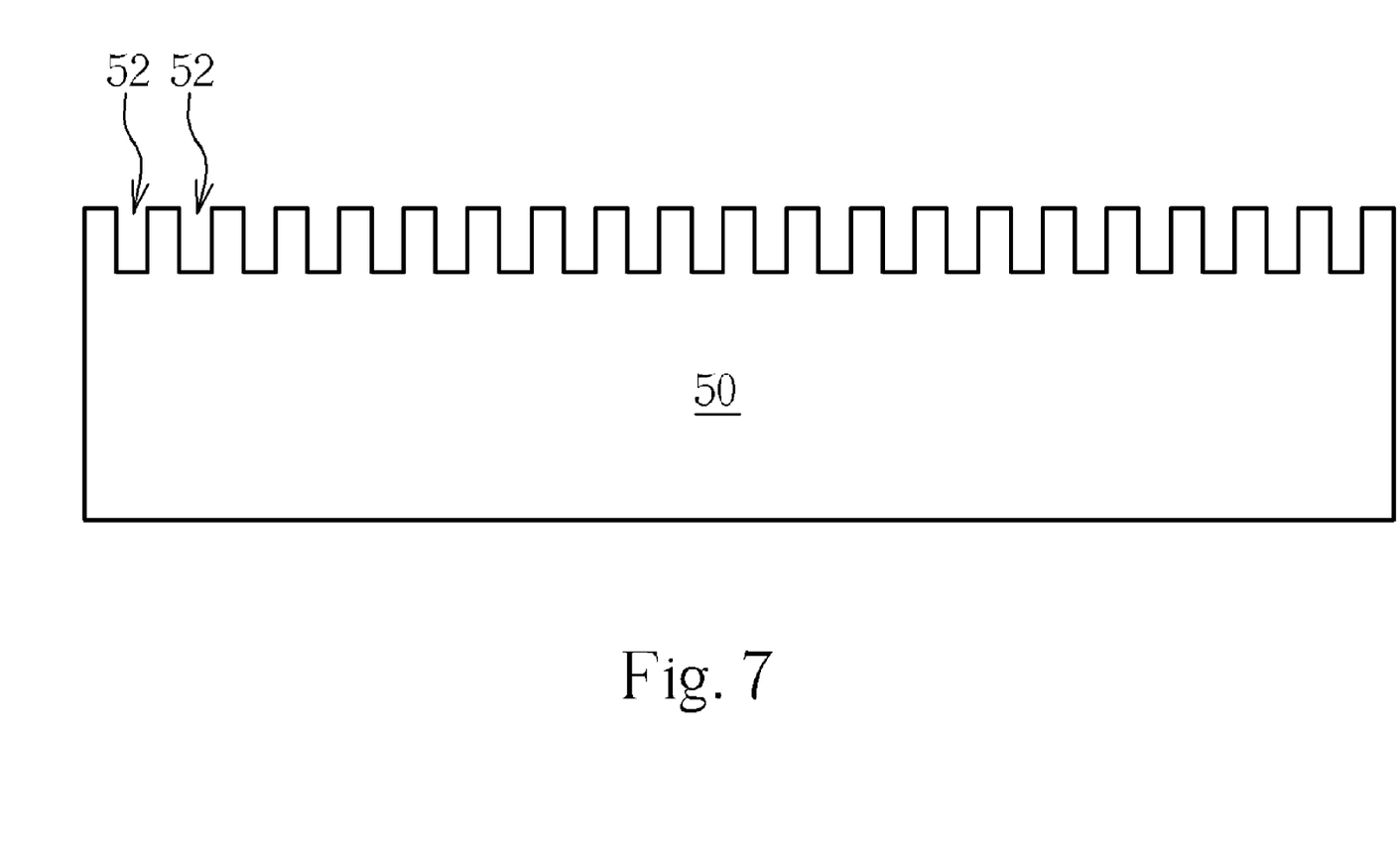
FIG. 7 to FIG. 15 are schematic diagrams illustrating a method of fabricating a microphone device in accordance with a preferred embodiment of the present invention.
Figure 8:
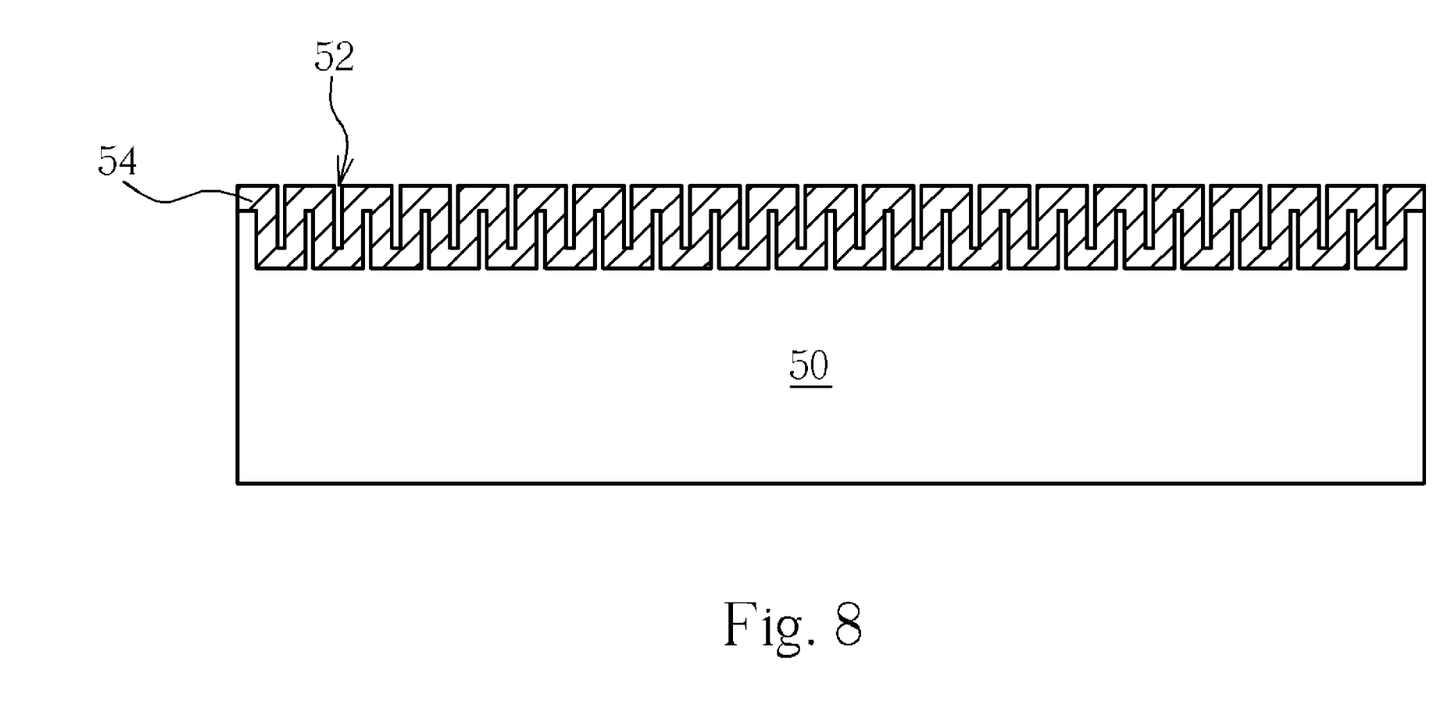

As shown in FIG. 7, a substrate 50 e.g. a silicon wafer or an SOI wafer is provided. Subsequently, a plurality of trenches 52 are formed in the front surface of the substrate 50 by deep etching techniques such as inductively coupled plasma reactive ion etching (ICPRIE), deep X ray lithography, or electron cyclotron resonance (ECR) plasma etching. In this embodiment, the line width of the trench 52 is 4 micrometers, and the depth of the trench 52 is 10 micrometers.

Figure 9:
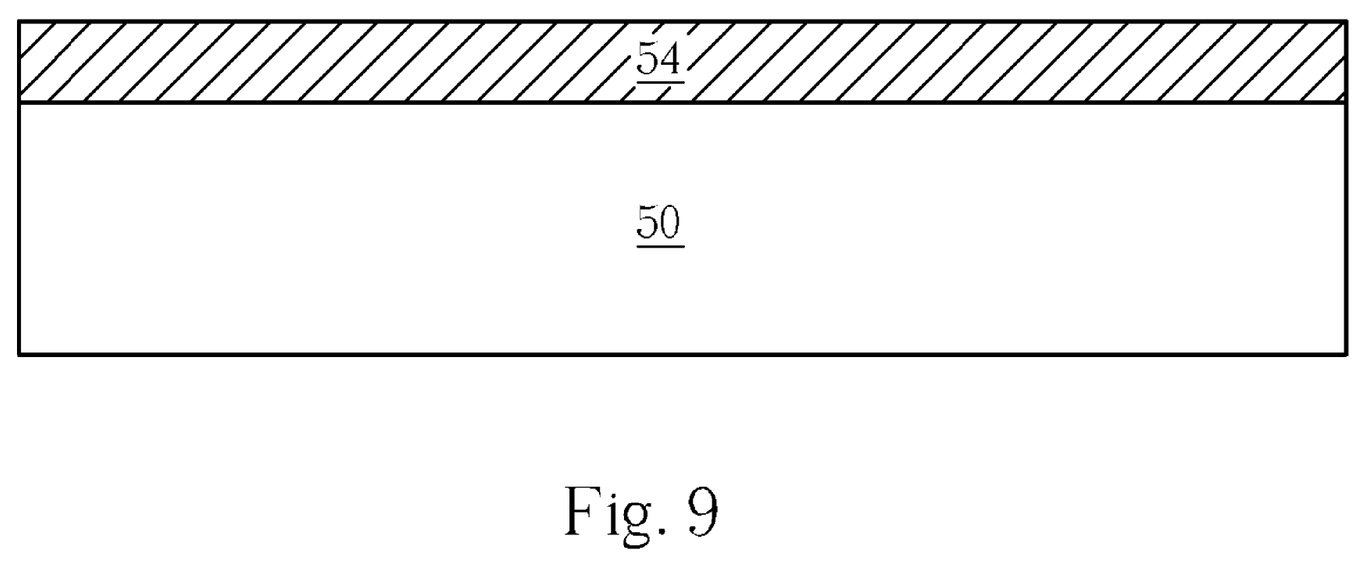
Figure 10:
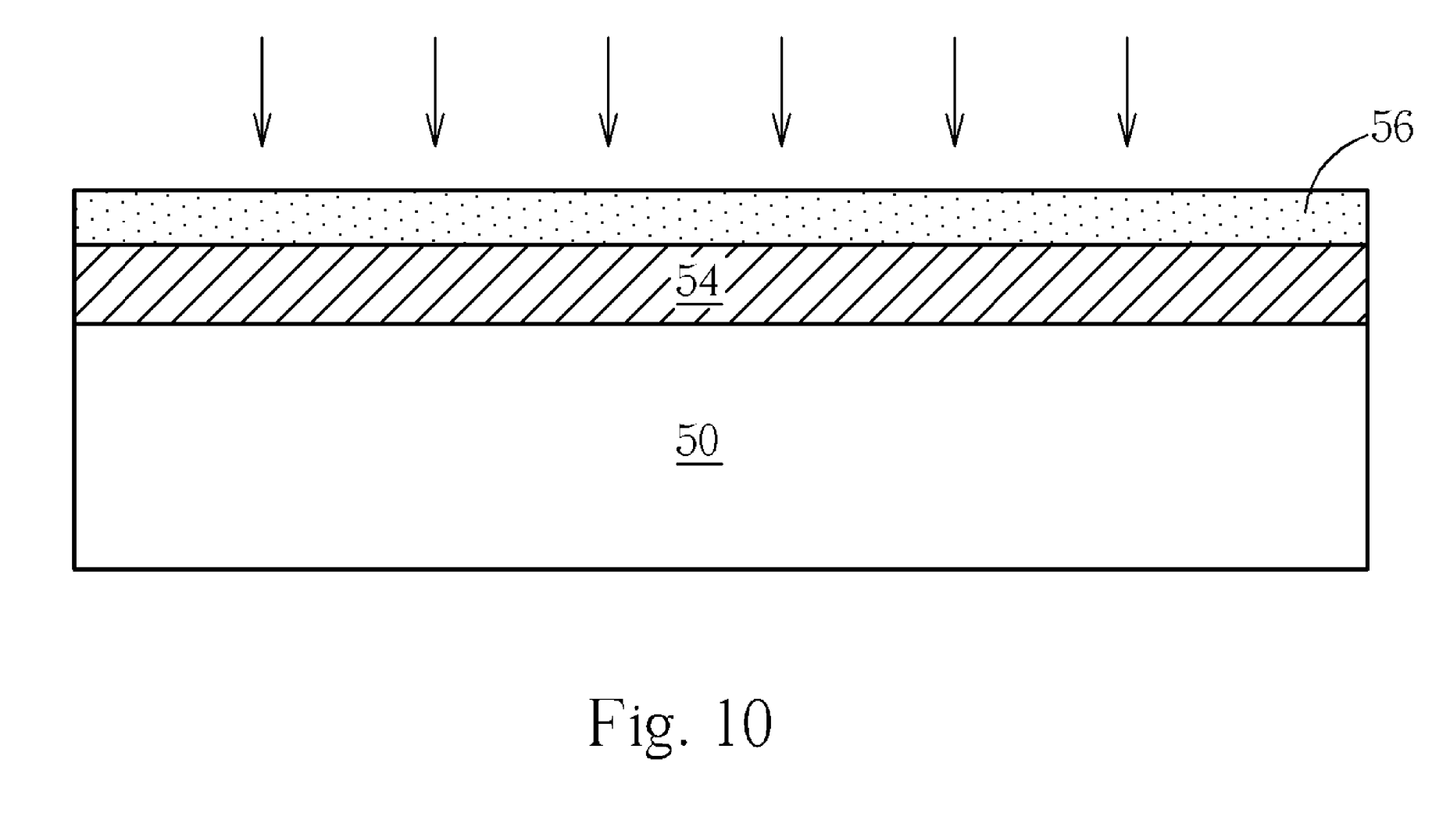

As shown in FIG. 9 and FIG. 10, a thermal oxidization process is performed to form a thermal oxide layer 54 on the inner walls of the trenches 52 and on the front surface of the substrate 50 as well. In this embodiment, the thermal oxide layer 54 can fill up the trenches 52 as long as its thickness reaches 2 micrometers. It is appreciated that the layout density of the trenches 52 is decided according to the rate of increase in volume of the thermal oxide layer 54. Specifically, the volume of silicon oxide is approximately 2.2 times larger than the volume of un-oxided silicon. Thus, the thermal oxide layer 54 can fill up the trenches 52, and cover the front surface of the substrate 50 to form an even plane by pre-calculation. In this embodiment, the overall thickness of the thermal oxide layer 54 is approximately 12 micrometers, which equals to the depth of the trench 52 plus the thickness of the thermal oxide layer 54 disposed on the front surface of the substrate 50. The actual cycle time of fabricating the thermal oxide layer 54 with a thickness of 12 micrometers is substantially equal to the time of directly forming a thermal oxide layer with a thickness of 2 micrometers on the substrate 50, and thus the cycle time is dramatically reduced.

Figure 11:
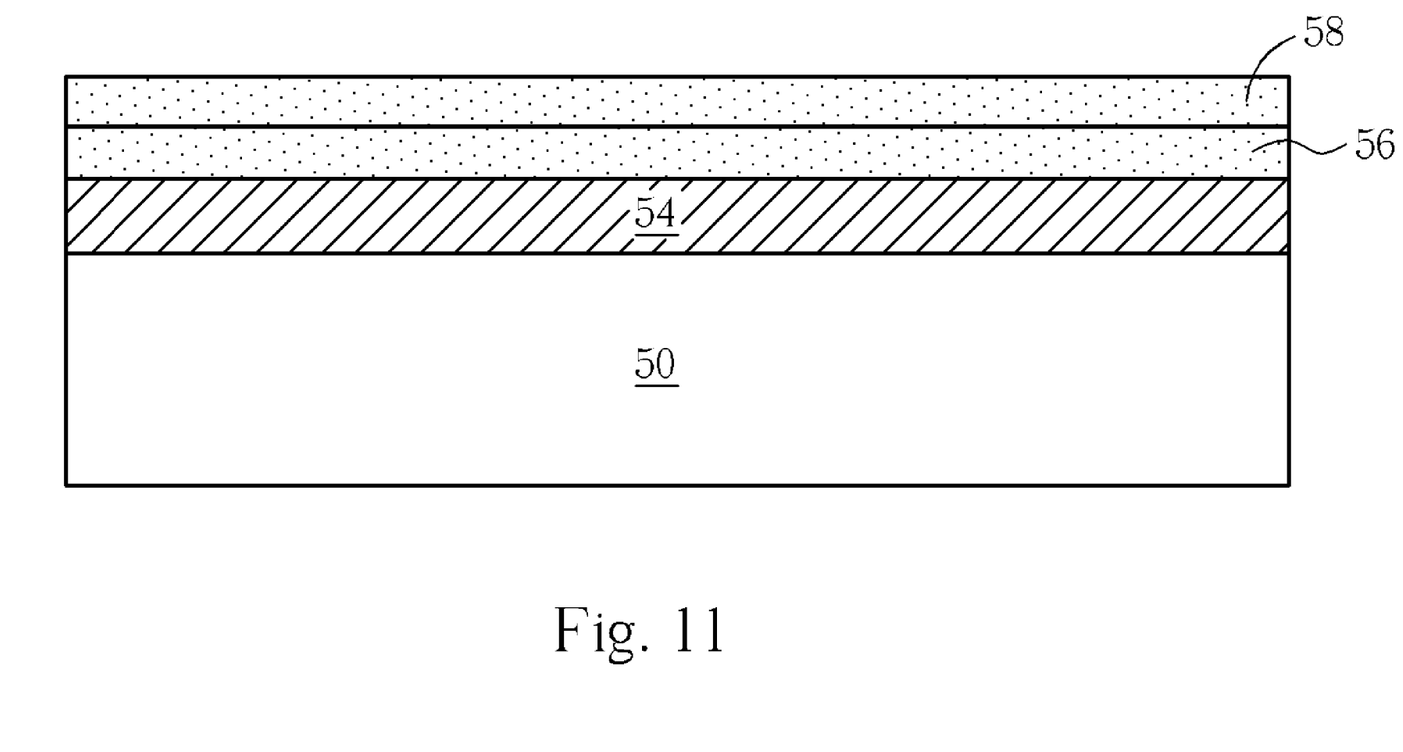

As shown in FIG. 10, a structural layer is subsequently fabricated. A first structural layer 56 is deposited on the thermal oxide layer 54. The first structural layer 56 can be single crystalline silicon, amorphous crystalline silicon, semi-amorphous crystalline silicon or polycrystalline silicon. Subsequently, an implantation process is performed to implant dopants into the first structural layer 56. As shown in FIG. 11, a second structural layer 58 is deposited on the first structural layer 56. The material of the second structural layer 58 can be single crystalline silicon, amorphous crystalline silicon, semi-amorphous crystalline silicon or polycrystalline silicon. An annealing process is then carried out to reduce the stress of the first structural layer 56 and the second structural layer 58, thereby forming a low-stress structural layer.

It is appreciated that the stress direction of the first structural layer 56 and the second structural layer 58 may differ if different materials are selected. For instance, if amorphous crystalline silicon or polycrystalline silicon is used, compressive stress tends to occur. On such a condition, boron can be implanted to provide tensile stress after the annealing process to compensate for the stress of the first structural layer 56 and the second structural layer 58. If semi-amorphous crystalline silicon is used, tensile stress tends to occur. In such a case, phosphorus can be implanted to provide a compressive stress to adjust the stress of the first structural layer 56 and the second structural layer 58. It is also noted that the stress may be adjusted not only by changing the concentration of dopants, but also by selecting different materials to be the first structural layer 56 and the second structural layer 58, or by controlling the thickness ratio of the first structural layer 56 to the second structural layer 58.

Figure 12:
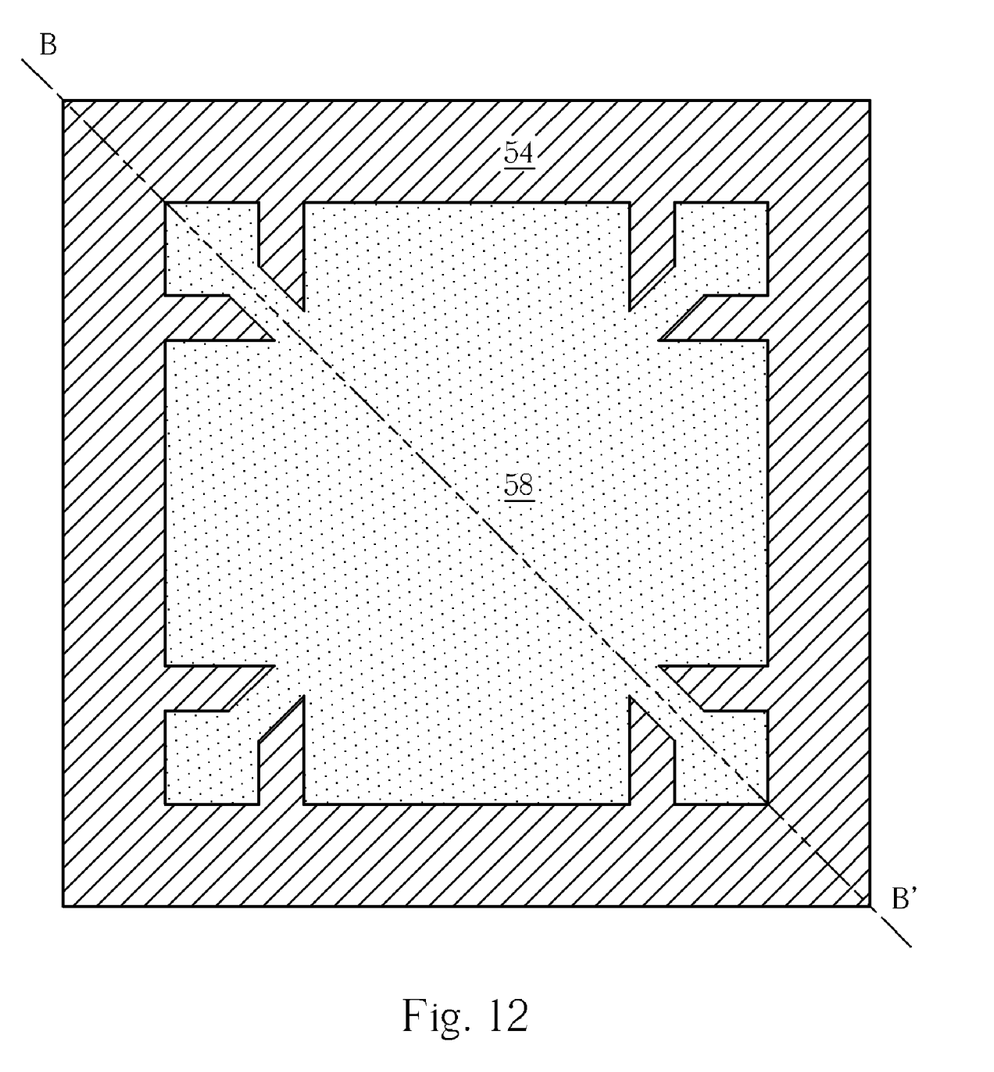
Figure 13:
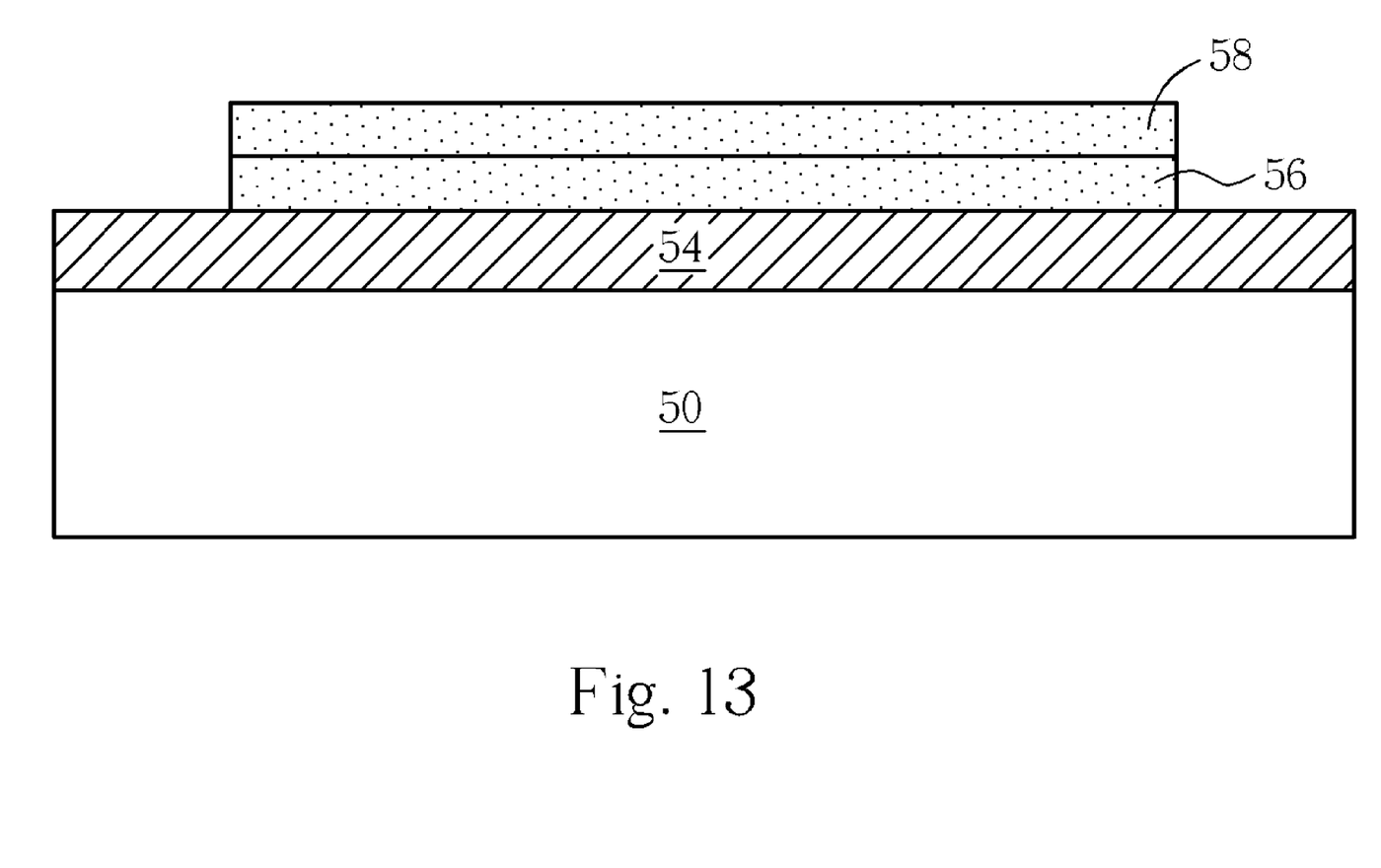

Refer to FIG. 12 and FIG. 13, FIG. 12 is a top view and FIG. 13 is a cross-sectional view along a tangent line BB". As shown in FIG. 12 and FIG. 13, a portion of the first structural layer 56 and the second structural layer 58 is removed by photolithography and etching technique to define the location of a diaphragm.

Figure 14:
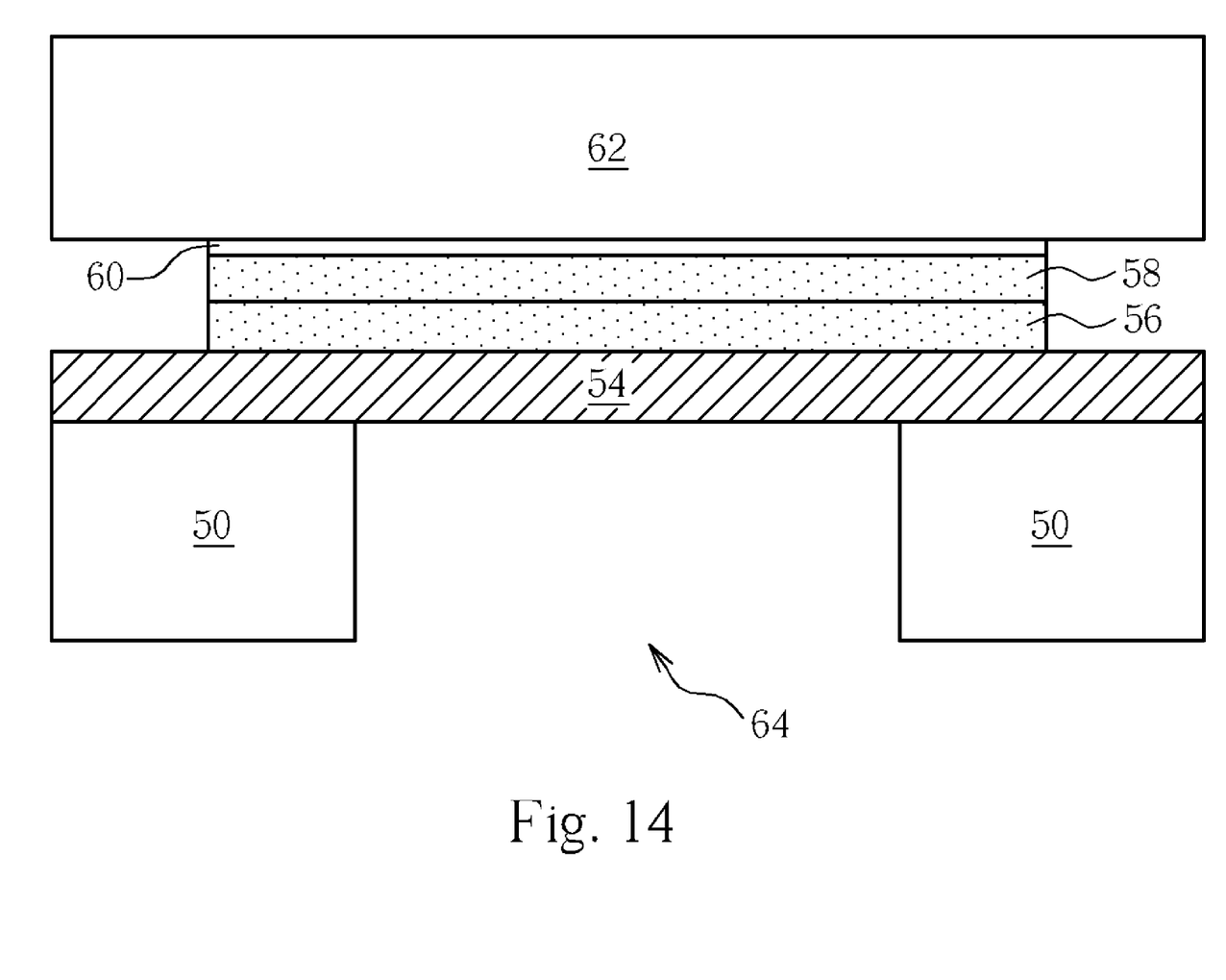
Figure 15:
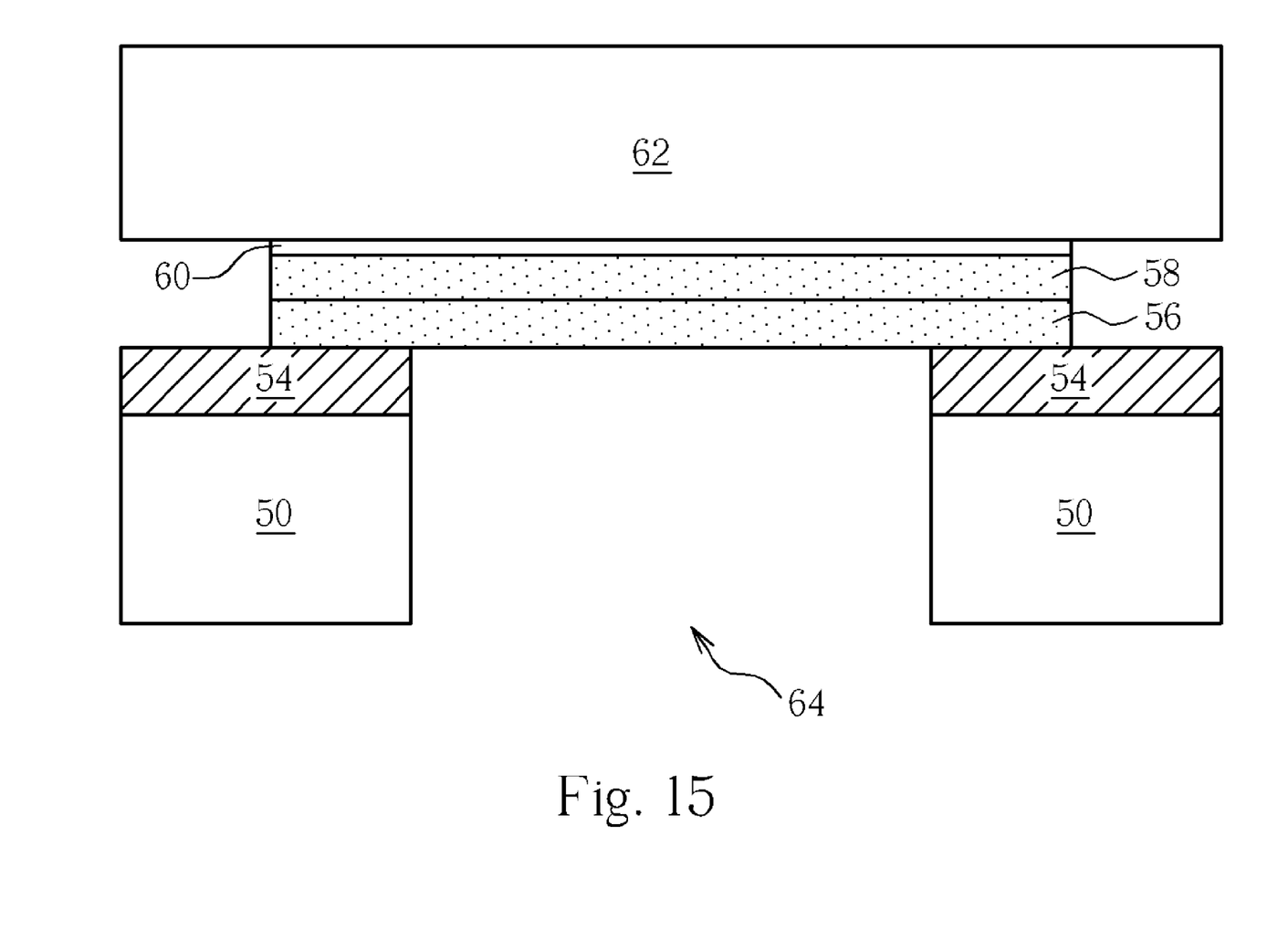

As shown in FIG. 14, a back chamber is subsequently formed. The second structural layer 58 is mounted to a support wafer 62, e.g. a wafer, with a bonding layer 60, and a back chamber 64 corresponding to the diaphragm is formed in the back surface of the substrate 50 by deep etching techniques. The deep etching techniques may be ICPRIE, deep X ray lithography, ECR plasma etching, or other suitable skills. It is noted that the back chamber 64 has a vertical sidewall, and exposes a portion of the thermal oxide layer 54 so that the first structural layer 56 and the second structural layer 58 are suspended. Accordingly, the microphone device is fabricated.

The method of the present invention is not limited to fabricate capacitive microphone devices, and may be applied to form various types of microphone devices or other devices having a suspended diaphragm e.g. micro pressure sensor. In addition, the method of the present invention may be applied to fabricate any thermal oxide layer for reducing the cycle time. Also, the method of reducing the stress by virtue of selecting different materials, adjusting the thickness ratio or dopants may be applied is not limited to fabricating microphone devices.

In brief, the method of fabricating microphone devices has the following advantages:

1) The cycle time of forming the thermal oxide layer is reduced.

2) The structural layer is low-stress.

3) The back chamber has a vertical sidewall, which improves the device integration.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a microphone device, comprising:

providing a substrate;

forming a plurality of trenches in a front surface of the substrate;

performing a thermal oxidization process to form a thermal oxide layer on inner walls of the trenches and on the front surface of the substrate, the thermal oxide layer filling up the trenches;

forming a first structural layer on the thermal oxide layer;

implanting dopants in the first structural layer;

forming a second structural layer on the first structural layer;

performing an annealing process to reduce a stress of the first structural layer and the second structural layer; and mounting the second structural layer on a support wafer, and forming a plurality of back chambers in a back surface of the substrate by deep etching techniques, each back chamber having a vertical sidewall, and the back chambers partially exposing the first structural layer.

2. The method of claim 1, wherein the trenches are formed by inductively coupled plasma reactive ion etching (ICPRIE) technique, deep X ray lithography technique, or electron cyclotron resonance (ECR) plasma etching technique.

3. The method of claim 1, wherein an overall thickness of the thermal oxide layer is equal to a depth of the trenches plus a thickness of the thermal oxide layer formed on the front surface of the substrate.

4. The method of claim 1, wherein the first structural layer and the second structural layer comprise single crystalline silicon, amorphous crystalline silicon or polycrystalline silicon.

5. The method of claim 1, wherein the dopants comprise boron or phosphorus.

6. The method of claim 1, wherein the stress of the first structural layer and the second structural layer is controlled by adjusting a concentration of the dopants.

7. The method of claim 1, wherein the stress of the first structural layer and the second structural layer is controlled by altering a thickness ratio of the first structural layer to the second structural layer.

8. The method of claim 1, wherein the back chambers are formed by inductively coupled plasma reactive ion etching technique, deep X ray lithography technique, or electron cyclotron resonance plasma etching technique.

9. The method of claim 1, further comprising patterning the first structural layer and the second structural layer subsequent to performing the annealing process to form a plurality of diaphragms corresponding to the back chambers.

* * * * *